(12) United States Patent
Yang

(10) Patent No.: US 6,429,691 B1
(45) Date of Patent: Aug. 6, 2002

(54) DIFFERENTIAL-INPUT CIRCUIT

(75) Inventor: Jungwook Yang, West Nyack, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/751,508

(22) Filed: Dec. 29, 2000

(51) Int. Cl.[7] .................... H03K 19/20; H03K 19/0175
(52) U.S. Cl. ........................................ 326/126; 326/77
(58) Field of Search ................................ 326/126, 127, 326/66, 67, 69, 73, 74, 77, 78

(56) References Cited

U.S. PATENT DOCUMENTS

| | | | |
|---|---|---|---|
| 4,734,593 A | * 3/1988 | Teymouri et al. | ........... 327/540 |
| 5,008,570 A | * 4/1991 | Coddington | .................. 326/78 |
| 5,117,134 A | 5/1992 | Aso | |
| 5,343,093 A | 8/1994 | Tran | |
| 5,352,941 A | 10/1994 | Matsumoto et al. | |
| 5,479,123 A | * 12/1995 | Gist et al. | .................... 327/108 |
| 5,583,456 A | * 12/1996 | Kimura | ....................... 326/115 |

* cited by examiner

*Primary Examiner*—Michael Tokar
*Assistant Examiner*—James H Cho
(74) *Attorney, Agent, or Firm*—F. Chau & Associates, LLP

(57) ABSTRACT

A circuit provides differential logic signals and includes a differential-input circuit having a first differential input and a second differential input. A first unit receives an input voltage signal and a supply voltage for providing a first voltage to the first differential input via a first node. A second unit receives the supply voltage for providing a second voltage to the second differential input via a second node. The differential-input circuit outputs a signal in accordance with the first and second voltages.

25 Claims, 17 Drawing Sheets

DIFFERENTIAL-INPUT CIRCUIT

BACKGROUND OF THE INVENTION

1. Field of the Invention

The present invention relates to a circuit and more particularly to a differential-input circuit for providing differential logic signals.

2. Description of the Related Art

Due to the increasing demand for high speed data transmission and RF (radio frequency) wireless communications, the differential-input circuit such as an ECL (emitter coupled logic) is widely used for providing differential logic signals because of its application in high speed operations. To implement the digital control of the high speed circuit, an interface circuit, such as a MOS (metal oxide semiconductor) circuit, is employed because it provides high density, low cost, and low power consumption. To fulfill the high speed operation, a differential ECL generally includes bipolar transistors which require a differential reduced-swing input voltage, e.g., a differential input of voltages with a swing less than a swing from ground voltage to supply voltage. However, a MOS circuit usually provides a single-ended rail-to-rail output, e.g., a single output of voltage with a full swing from ground voltage to supply voltage, but not a differential reduced-swing signal. Hence, it is desirable to provide a MOS interface circuit which can provide a differential reduced-swing voltage signal to a differential ECL circuit for outputting a differential logic signal.

Further, as the functions of the high speed communication circuits become complicated, the size of the MOS control logic grows accordingly larger. A larger area interface circuit creates disadvantages, such as more power consumption. Hence, the demand to maintain small area for MOS logic to ECL interface is also desirable. Furthermore, the MOS control logic consumes more power not only when it has a larger area, but by its nature, this kind of circuit consumes static power. To generate an intermediate voltage level in an interface to the ECL circuit, static power consumption through the resistors and transistors is unavoidable unless an external reference voltage is supplied. For example, a cellular phone can draw power from the battery when its power is on even though it does not transmit or receive signal yet. Hence, the demand to maintain low power consumption for interfacing to an ECL circuit is also desirable.

SUMMARY OF THE INVENTION

The present invention provides a differential reduced-swing input voltage to a differential-input circuit for outputting a differential logic signal. The present invention further provides a differential-input circuit which maintains area efficiency and low power consumption.

In one aspect of the present invention, there is provided a circuit for providing a differential logic signal. The circuit includes a differential-input circuit having a first differential input and a second differential input. A first unit receives an input voltage signal and a supply voltage for providing a first voltage to the first differential input via a first node. A second unit receives the supply voltage for providing a second voltage to the second differential input via a second node, wherein the differential-input circuit outputs a signal in accordance with the first and second voltages.

In another aspect of the present invention, there is provided a circuit for providing differential logic signal. The circuit includes a differential-input circuit having a first differential input and a second differential input. A first unit receives an input voltage signal and a supply voltage for providing a first voltage to the first differential input via a first node. A second unit receives the input voltage signal and the supply voltage for providing a second voltage to the second differential input via a second node, wherein the differential-input circuit outputs a signal in accordance with the first and second voltage.

In another aspect of the present invention, the circuit may include a logic device to provide an enable signal to the circuit for providing a low power consumption operation. In another aspect of the present invention, the circuit may include the same type transistors for providing small area. These and other aspects, features and advantages of the present invention will become apparent from the following detailed description of illustrative embodiments thereof, which is to be read in connection with the accompanying drawings.

BRIEF DESCRIPTION OF THE DRAWINGS

The above objects and advantages of the present invention will become more apparent by describing in detail embodiments thereof with reference to the attached drawings in which.

DESCRIPTION OF EMBODIMENTS

Figure 1:
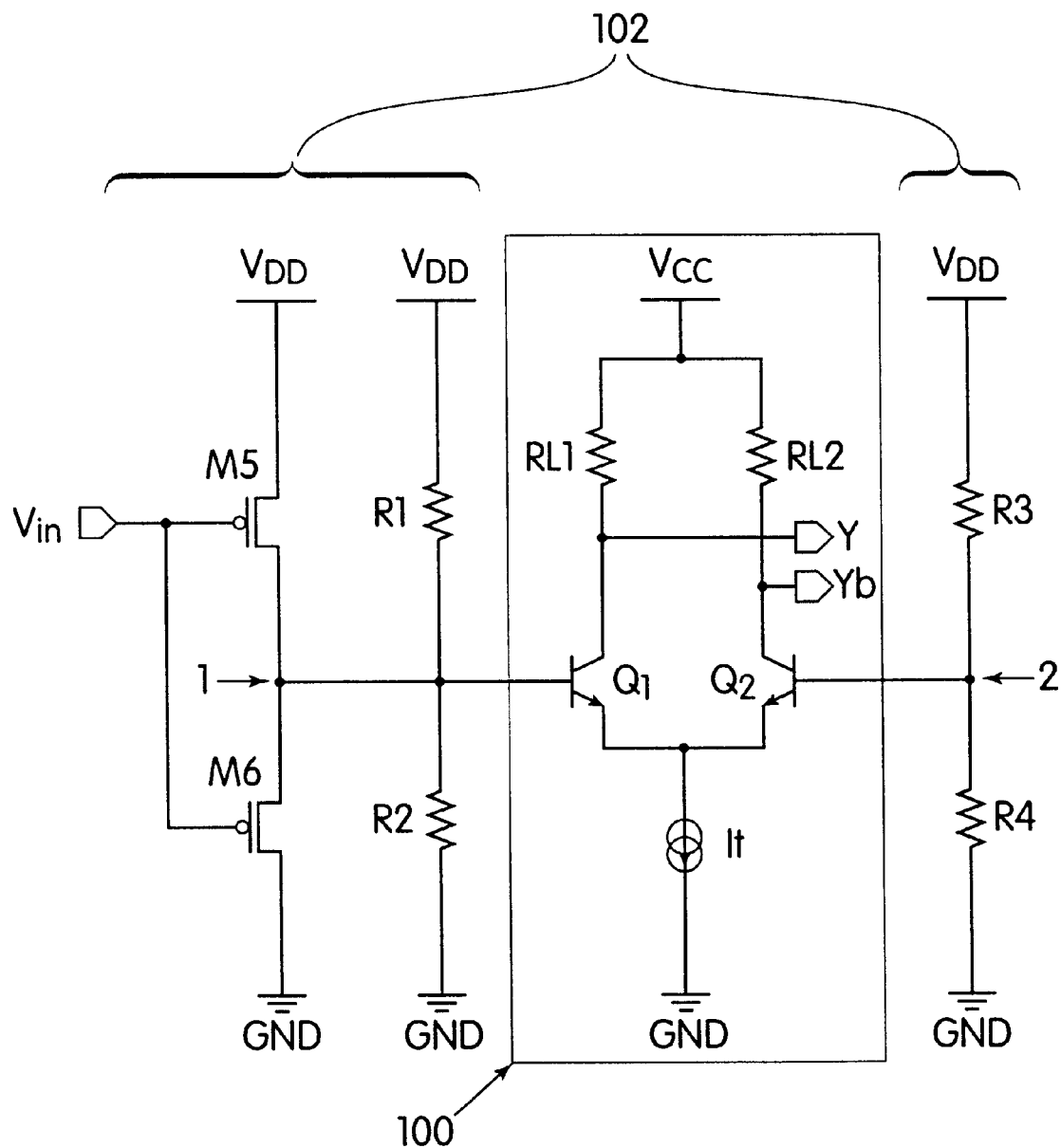
FIG. 1 is a schematic diagram of a circuit for providing a differential reduced-swing input voltage and outputting a differential logic signal according to an embodiment of the present invention.

The present invention will be described in terms of illustrative circuits. It is to be understood that these circuits are described with particular values for parameters, such as voltage, current, resistance, component sizes, etc. These values are illustrative and should not be construed as limiting the present invention.

Referring now in detail to the drawing in which like reference numerals identify similar or identical elements throughout the drawings.

FIG. 1 shows an embodiment of the present invention where an interface circuit 102 provides a differential reduced-swing voltage signal to a circuit 100. Note the interface circuit 102 represents the circuit other than circuit 100 in all FIGs of the specification.

In FIG. 1, reference numeral 102 illustratively represents a CMOS (complementary metal oxide semiconductor) interface circuit. Reference numeral 100 illustratively represents a bipolar PECL (positive emitter coupled logic) circuit which needs a differential input with reduced swing for noise-immune operation at high operating speed. It is to be understood that circuit 102 is an interface circuit including different types of MOS circuits, such as CMOS, pMOS, or nMOS. Circuit 100 may include other or different circuits which can benefit from an interface circuit of the present invention.

A CMOS, as well as other types of MOS, logic circuit inputs and outputs single-ended signal, e.g., the logic signal is inputted/outputted via a single line. Also, a CMOS logic signal swings from ground voltage for logic "LOW" to the supply voltage for logic "HIGH" or so-called a "rail-to-rail" full swing. The single-ended, rail-to-rail signal in a CMOS standard logic circuit does not meet the input requirement for a differential logic circuit, such as a PECL circuit, because a PECL circuit needs differential reduced-swing input voltage.

A differential input is a pair of signals, e.g., a main signal and a complementary signal, to represent logic information, wherein the complementary signal is an inverted version of the main signal. The differential logic circuit, such as a PECL circuit, takes the difference of the differential signals and performs the logic function. The differential logic circuit, such as a PECL circuit, is particularly useful in high-speed operation due to its noise-immune capabilities. For example, the noise coupled to the signal lines affects each line signal in the PECL circuit. The difference of line signals remains unaffected since, according to the invention, the noise on each line signal is about the same amount. This results in the difference between the line signals being unchanged. Further, a reduced-swing input is an input voltage centering around a supply voltage with a smaller magnitude than a rail-to-rail full swing, which consumes more time during a high-speed operation. A reduced-swing input voltage is thus advantageous for a differential logic circuit, such as PECL circuit, because the high-speed operation will not be slowed down by a rail-to-rail full swing.

Referring to FIG. 1, in one embodiment of the present invention, a CMOS interface circuit 102 provides differential reduced-swing voltages as the inputting voltages via node 1 and node 2, respectively, to a PECL circuit 100. The reduced-swing inputs (e.g., between about 300 mV and about 700 mV) centered around the middle of a supply voltage (e.g., 1 V) are provided to bias input differential stage of the bipolar transistors Q1 and Q2 in bipolar PECL 100.

Resistors R1 and R2 in the CMOS interface circuit 102 are designed such that they provide appropriate bias voltage at node 1. Resistors R3 and R4 are also designed to provide the same voltage at node 2 as that of node 1. For example, R1/R2=R3/R4, while R1=R3 and R2=R4.

Transistor M5 is a pMOS, and transistor M6 is an nMOS. When an input voltage signal Vin is logic "HIGH" (in this case, VDD in CMOS logic level), the transistor M6 turns on and transistor M5 turns off. As the transistor M6 turns on, transistor M6 adds parallel resistance between node 1 and the ground (GND), so the resistance between transistor M6 and resistor R2 will be lower than resistor R4. Hence, the voltage at node 1 will go lower than that in node 2. For example, if resistors R1, R2, R3 and R4 are all, e.g., 1 kΩ, VDD and VCC are, e.g., 3 V, and the on-resistance of transistor M6 is designed to be, e.g., 1 kΩ, then the voltage at node 2 is, e.g., 1.5 V (3 V×1.0 kΩ/2.0 kΩ), and node 1 becomes, e.g., 1 V (3 V×0.5 kΩ/1.5 kΩ). In this example, the PECL 100 input node 1 is 500 mV lower than the other input node 2, and in turn the base of transistor Q1 is lower than the base of transistor Q2. As a result, transistor Q1 turns off and transistor Q2 turns on allowing the tail current, It, flowing through the transistor Q2 to provide a voltage drop across load resistor RL2, e.g., (It)(RL2). Hence, the output Y becomes "HIGH" and Yb becomes "LOW" in PECL 100 level in FIG. 1.

On the other hand, when the input voltage signal Vin is logic "LOW" (0 V), transistor M5 turns on and transistor M6 turns off. As transistor M5 turns on, transistor M5 adds parallel resistance between node 1 and VDD, so the resistance between transistor M5 and resistor R1 will be lower than resistor R3. Hence, the voltage at node 1 will go higher than that in node 2. If the on-resistance of transistor M5 is designed to be, e.g., 1 kΩ, the voltage at node 2 is still, e.g., 1.5 V (3 V×1.0 kΩ/2.0 kΩ), and node 1 is now, e.g., 2 V (3 V×1.0 kΩ/1.5 kΩ). In this example, the PECL 100 input node 1 is 500 mV higher than the other input node voltage at node 2, and the output Y is "LOW" and Yb is "HIGH."

According to this structure of the present invention as shown in FIG. 1, the CMOS interface circuit 102 provides differential reduced-swing input voltages to a PECL circuit.

Figure 2:
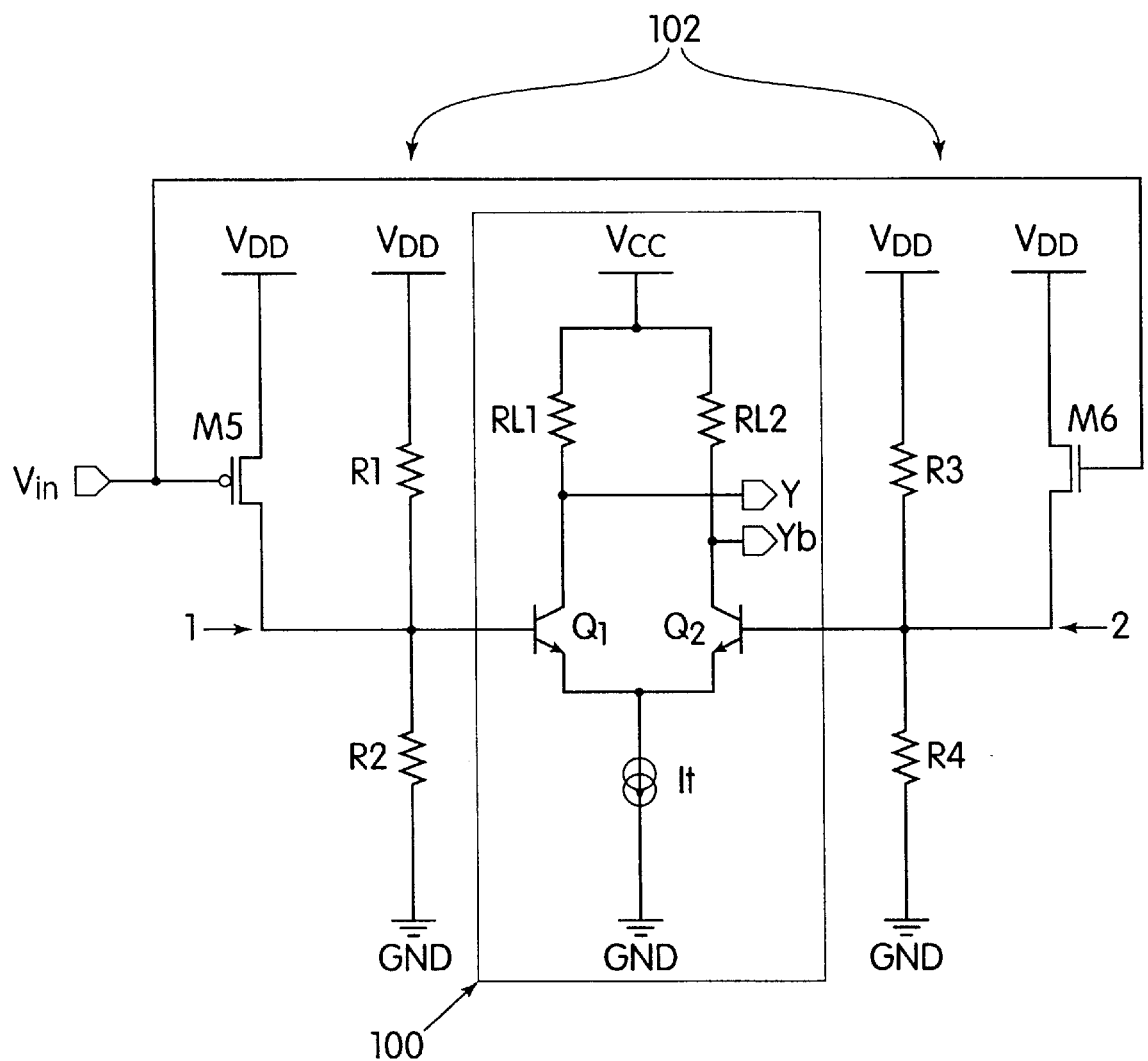
FIG. 2 is a schematic diagram of a circuit for providing a differential reduced-swing input voltage and outputting a differential logic signal according to another embodiment of the present invention.

FIG. 2 shows another embodiment of the present invention where an interface circuit 102 provides differential reduced-swing voltage signal to a PECL circuit 100. FIG. 2 is substantially the same as FIG. 1 except for the location of transistor M6 in the interface circuit 102. In FIG. 2, the nMOS M6 has been moved to between node 2 and VDD, from being between node 1 and GND in FIG. 1. Transistors M5 and M6 are designed to have on-resistance of, e.g., 1 kΩ when transistors M5 and M6 are on. In FIG. 2, the same parts as those shown in FIG. 1 are represented with like reference numbers to avoid redundant description, accordingly, their explanation will be omitted.

When input voltage signal Vin is "HIGH," transistor M6 is turned on, and transistor M5 turns off. The voltage at node 1 is set by the resistive divider R3 and R4, which is, e.g., 1.5 V (3 V×1.0 kΩ/2.0 kΩ). Transistor M6 reduces the resistance between VDD and node 2, so the voltage at node 2 will go up to, e.g., 2 V (3 V×1.0 kΩ/1.5 kΩ). In this example, the PECL 100 input node 1 is 500 mV lower than the other input node 2. As a result, transistor Q1 turns off and transistor Q2 turns on allowing the tail current flowing through the transistor Q2 to provide a voltage drop across load resistor RL2. Hence, the output Y becomes "HIGH" and Yb becomes "LOW" in PECL 100 level in FIG. 2.

When input voltage signal Vin is "LOW," transistor M5 turns on and transistor M6 turns off, and the voltage at node 2 is, e.g., 1.5 V (3 V×1.0 kΩ/2.0 kΩ, same as in FIG. 1). As transistor M5 is on, M5 reduces the resistance between VDD and node 1. Hence, the voltage at node 1 will go up to, e.g., 2 V (3 V×1.0 kΩ/1.5 kΩ). In this example, the PECL 100 input node 1 is 500 mV higher than the other input node voltage at node 2, and the output Y is "LOW" and Yb is "HIGH." Accordingly, the embodiment of FIG. 2, the CMOS interface circuit 102 also provides differential reduced-swing input voltages to a PECL circuit 100.

Figure 3:
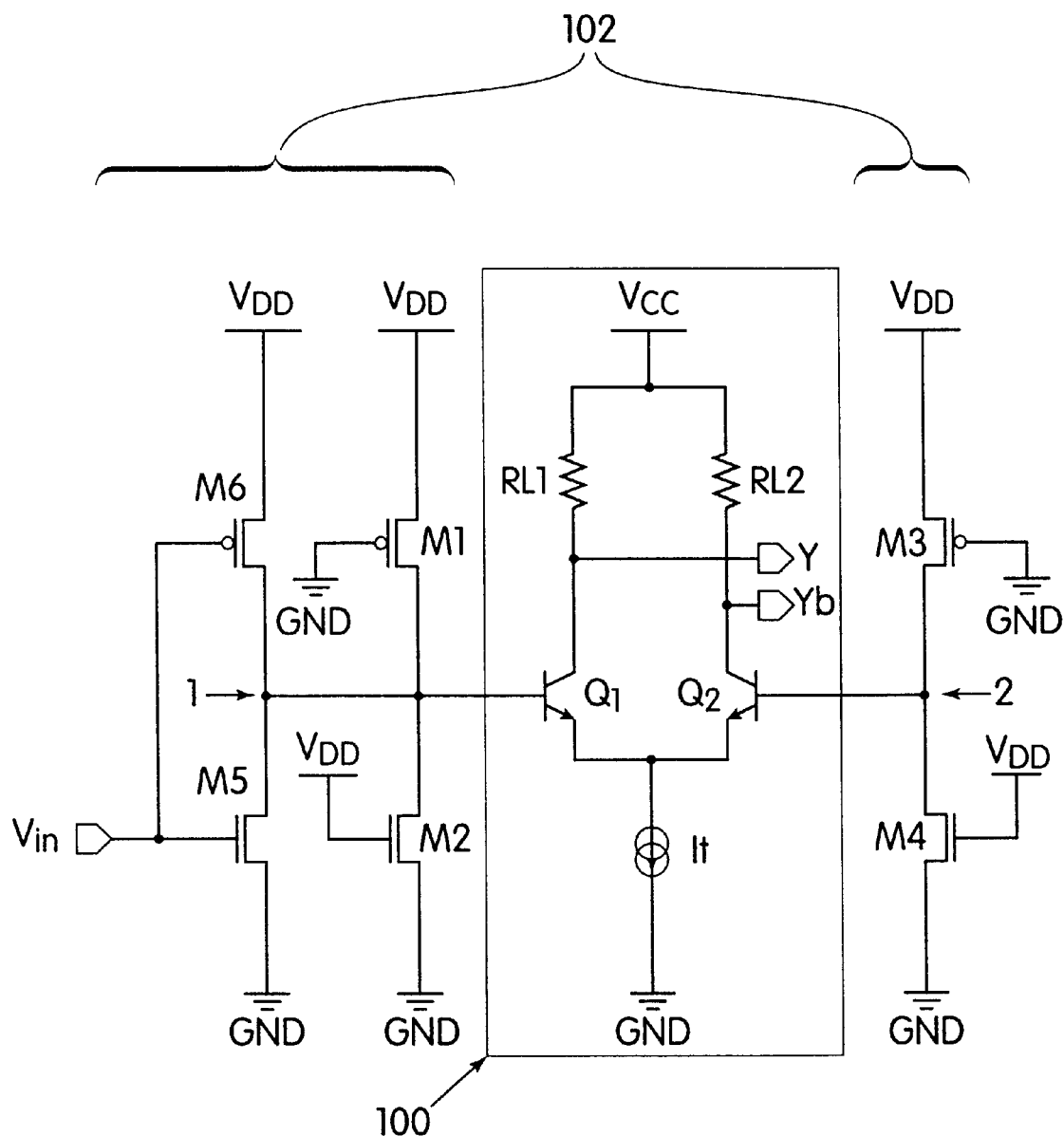
FIG. 3 is a schematic diagram of a circuit for illustrating the selection of appropriate bias input voltage of another embodiment of the circuit in FIG. 1.

FIG. 3 is another embodiment of the present invention which illustrates the selection of appropriate bias input voltage for PECL 100. FIG. 3 is substantially the same as FIG. 1 except that the resistors R1, R2, R3, and R4 (FIG. 1) are replaced with CMOS transistors M1, M2, M3, and M4, respectively. In FIG. 3, the appropriate bias voltage at the input of the PECL 100 circuit can be provided by choosing the size W/L (Width/Length ratio) of transistors M1, M2, M3, and M4. In light of FIG. 1, the on-resistance of transistors M1, M2, M3, and M4 can be designed to be, e.g., about 1 kΩ, respectively, in this example.

Figure 4:
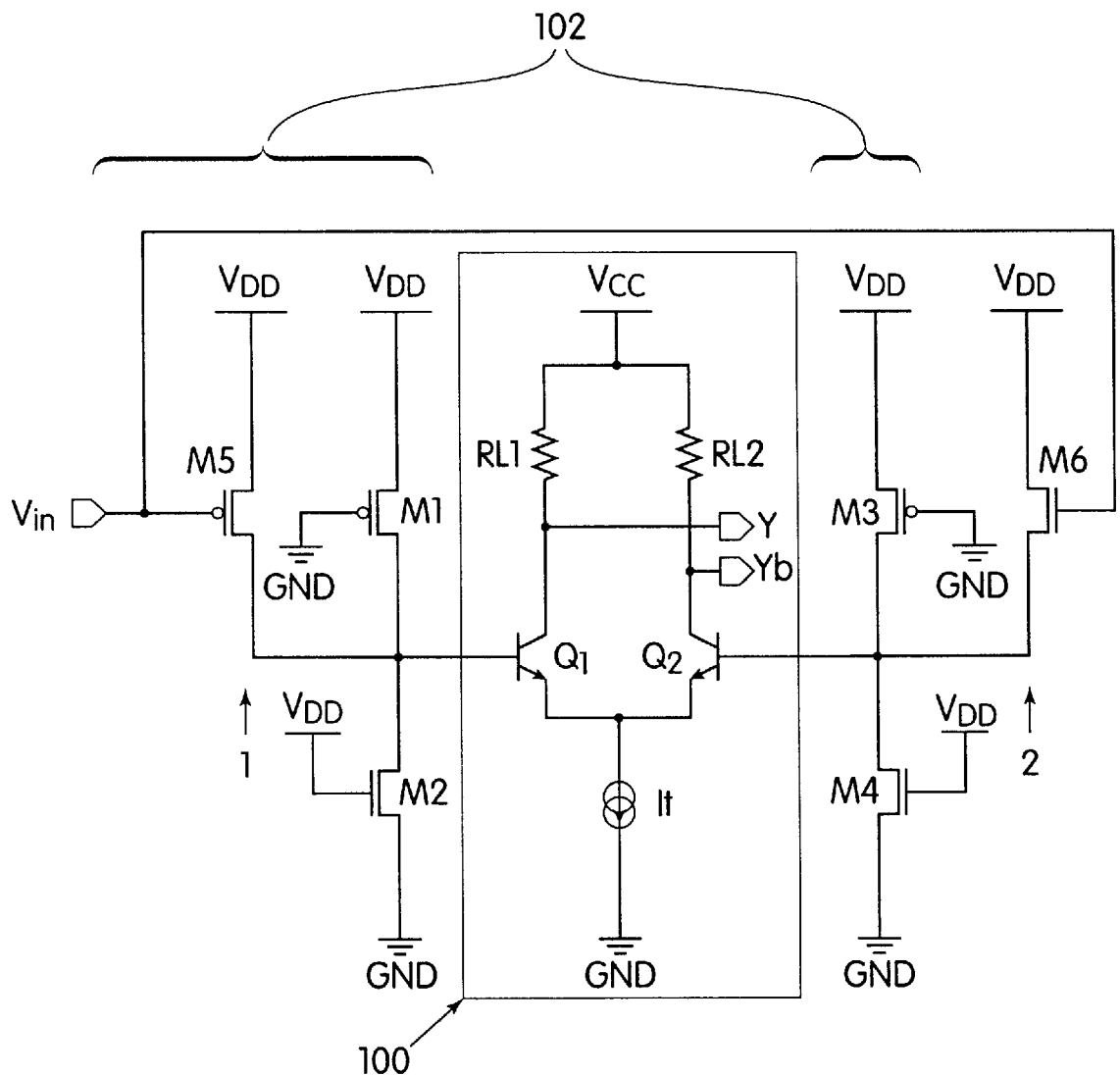
FIG. 4 is a schematic diagram of a circuit for illustrating the selection of appropriate bias input voltage of another embodiment of the circuit in FIG. 2.

FIG. 4 shows another embodiment of the present invention which illustrates the selection of appropriate bias input voltage for PECL 100. FIG. 4 is substantially the same as FIG. 2 except that the resistors R1, R2, R3, and R4 (FIG. 2) are replaced with CMOS transistors M1, M2, M3, and M4, respectively. In FIG. 4, the appropriate bias voltage at the input of the PECL 100 circuit can be provided by choosing the size W/L of transistors M1, M2, M3, and M4. In light of FIG. 1, the on-resistance of transistors M1, M2, M3, and M4 can be designed to be, e.g., about 1 kΩ, respectively, in this example.

Figure 5:
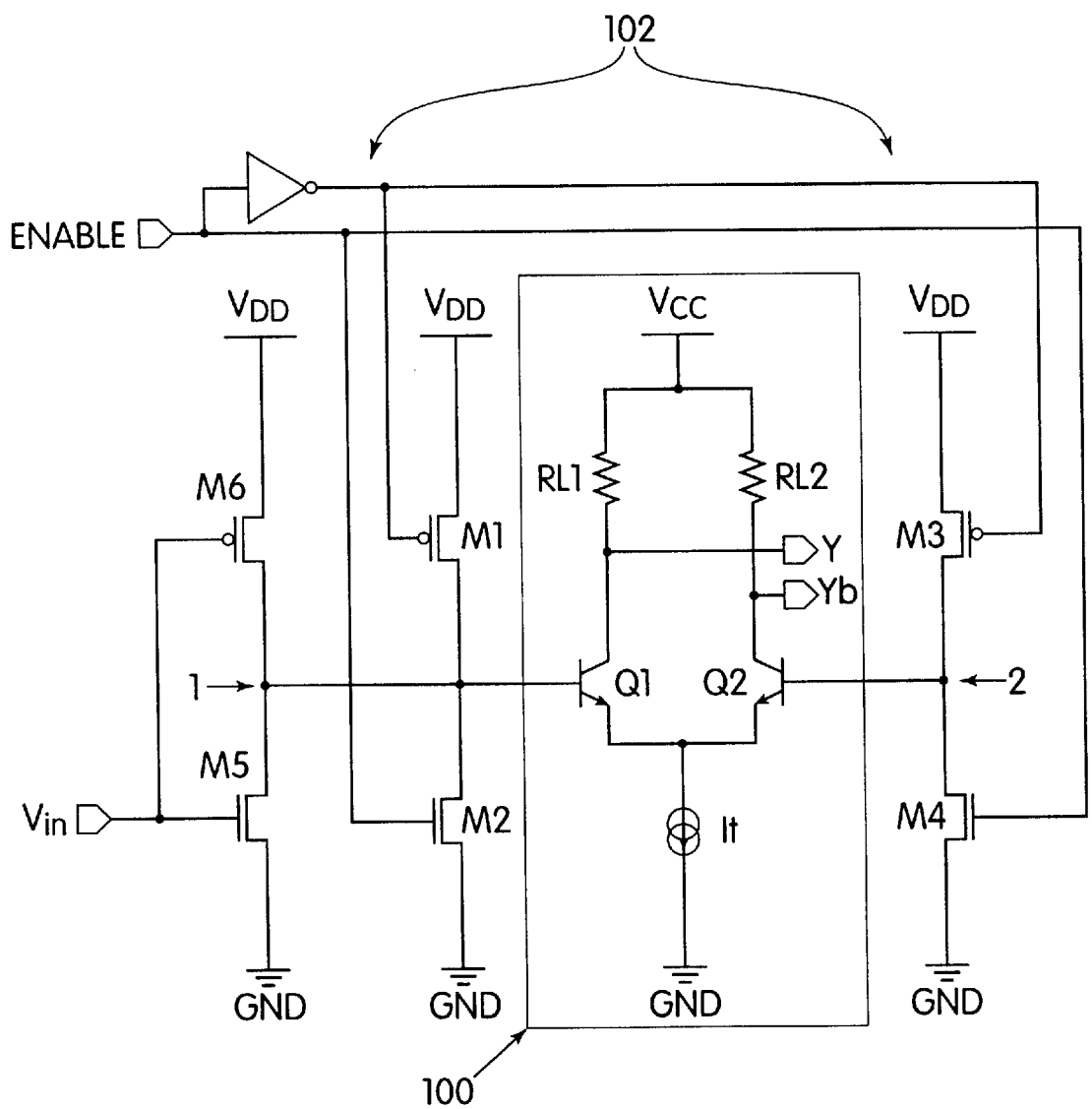
FIG. 5 is a schematic diagram of a circuit with the advantage of low power consumption of another embodiment of the circuit in FIG. 3.

FIG. 5 shows another embodiment of the present invention with the advantage of low power consumption. The embodiment in FIG. 5 is made by adding an ENABLE signal to the circuit in FIG. 3. The gate nodes of transistors M1 through M4 in interface circuit 102 are digitally controlled by connecting to an ENABLE signal, so that they can be enabled or disabled. When the logic signal in ENABLE is "HIGH," the transistors M1 through M4 are turned on. When the logic signal in ENABLE is "LOW," the transistors M1 through M4 are turned off to be in a standby mode. Thus, static power consumption through the transistors M1 through M4 can be reduced during the standby mode.

Figure 6:
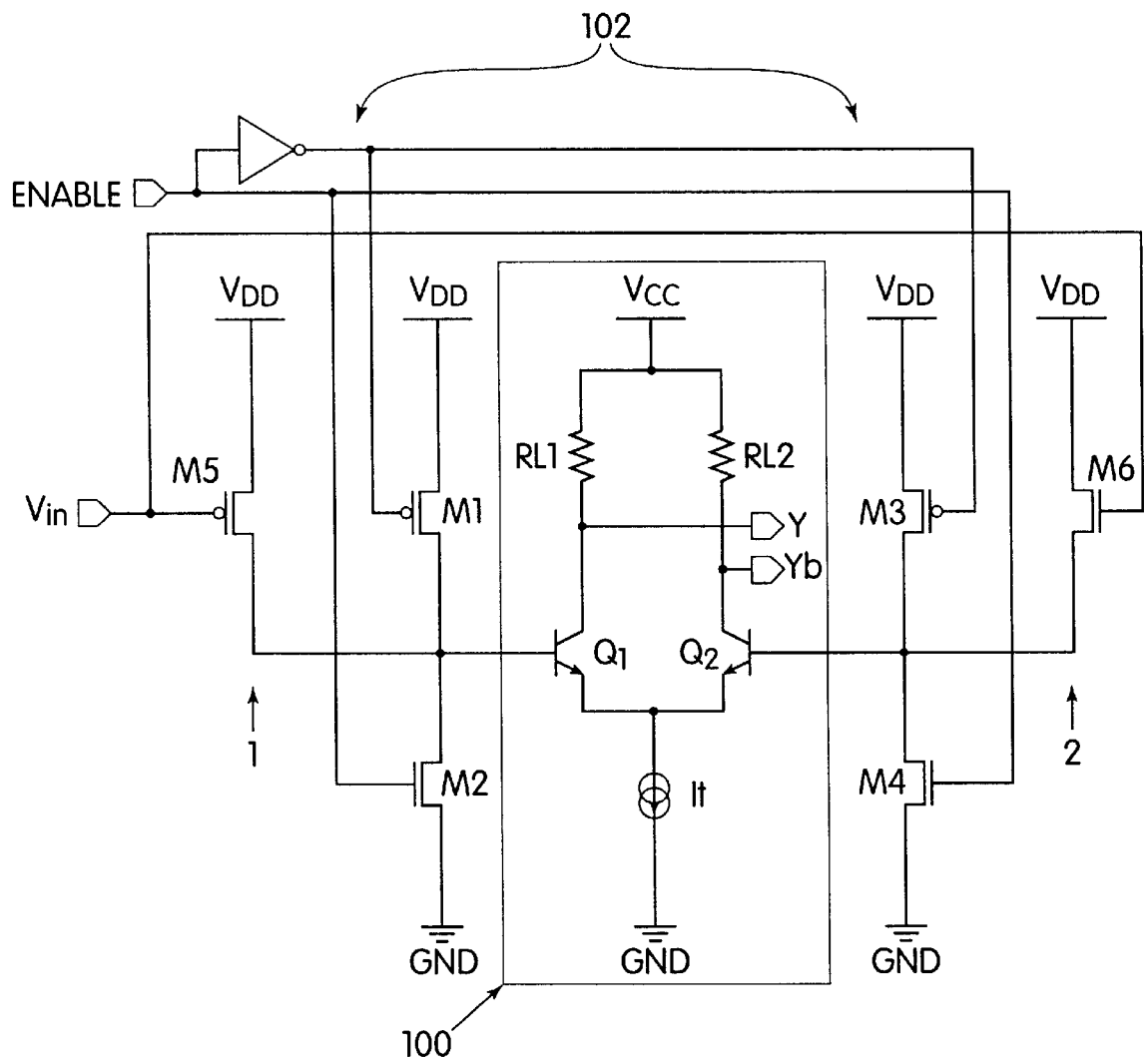
FIG. 6 is a schematic diagram of a circuit with the advantage of low power consumption of another embodiment of the circuit in FIG. 4.

FIG. 6 shows another embodiment of the present invention with the advantage of low power consumption. The embodiment in FIG. 6 is made by adding an ENABLE signal to the circuit in FIG. 4. In FIG. 6, the gate nodes of transistors M1 through M4 in interface circuit 102 are digitally controlled by connecting to an ENABLE signal, so that they can be enabled or disabled. When the logic signal in ENABLE is "HIGH," the transistors M1 through M4 are turned on. When the logic signal in ENABLE is "LOW," the transistors M1 through M4 are turned off to be in a standby mode to reduce the power consumption.

Figure 7:
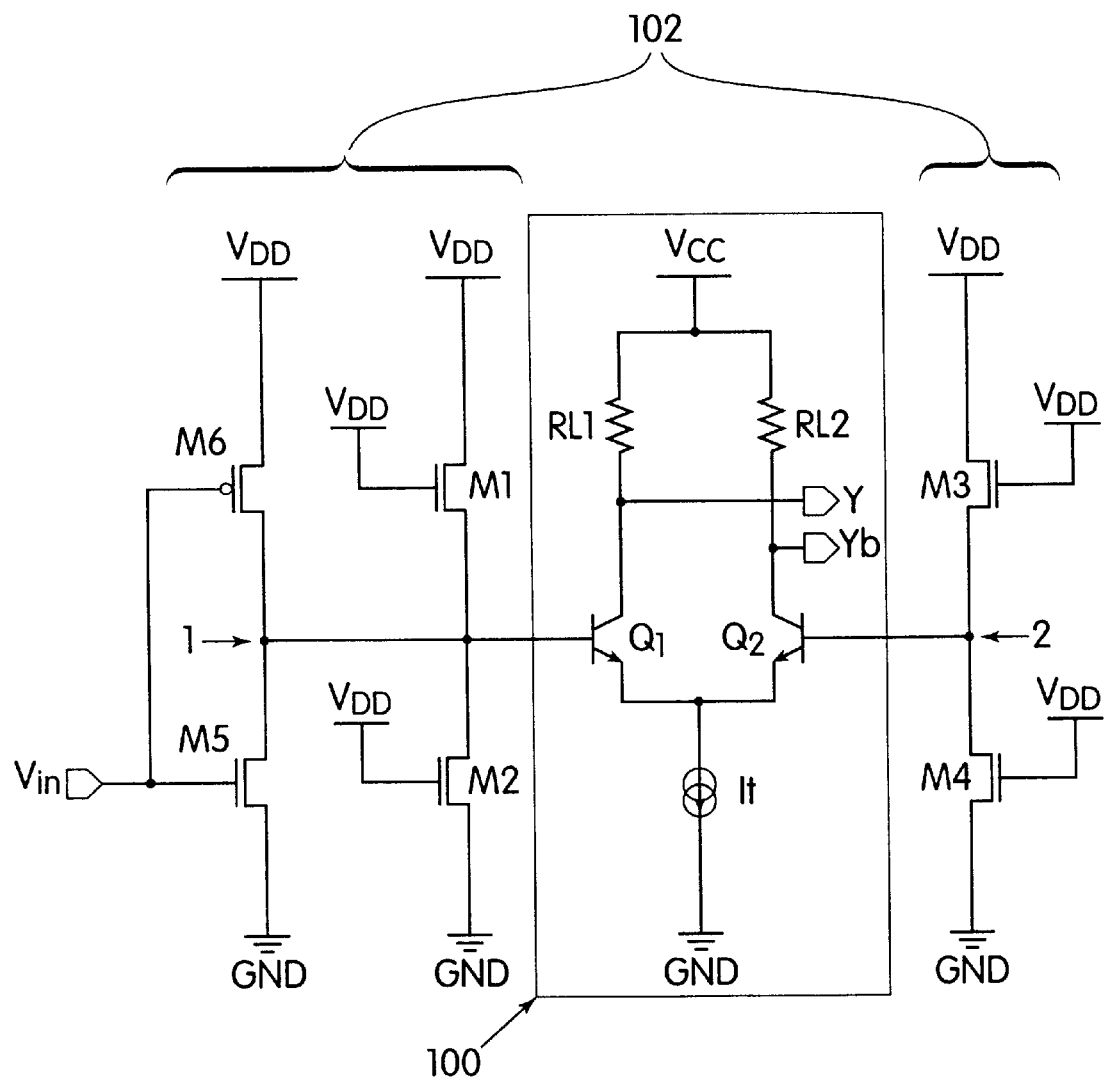
FIG. 7 is a schematic diagram of a circuit comprising n-type transistors of yet another embodiment of the circuit in FIG. 3.

FIG. 7 shows another embodiment of the present invention. The circuit of FIG. 7 is the same as FIG. 3 except that the CMOS transistors M1 through M4 in interface circuit 102 are replaced with nMOS, and the gate nodes of nMOS transistor M1 and M3 are tied to VDD to turn M1 and M3 on in the operating mode.

Figure 8:
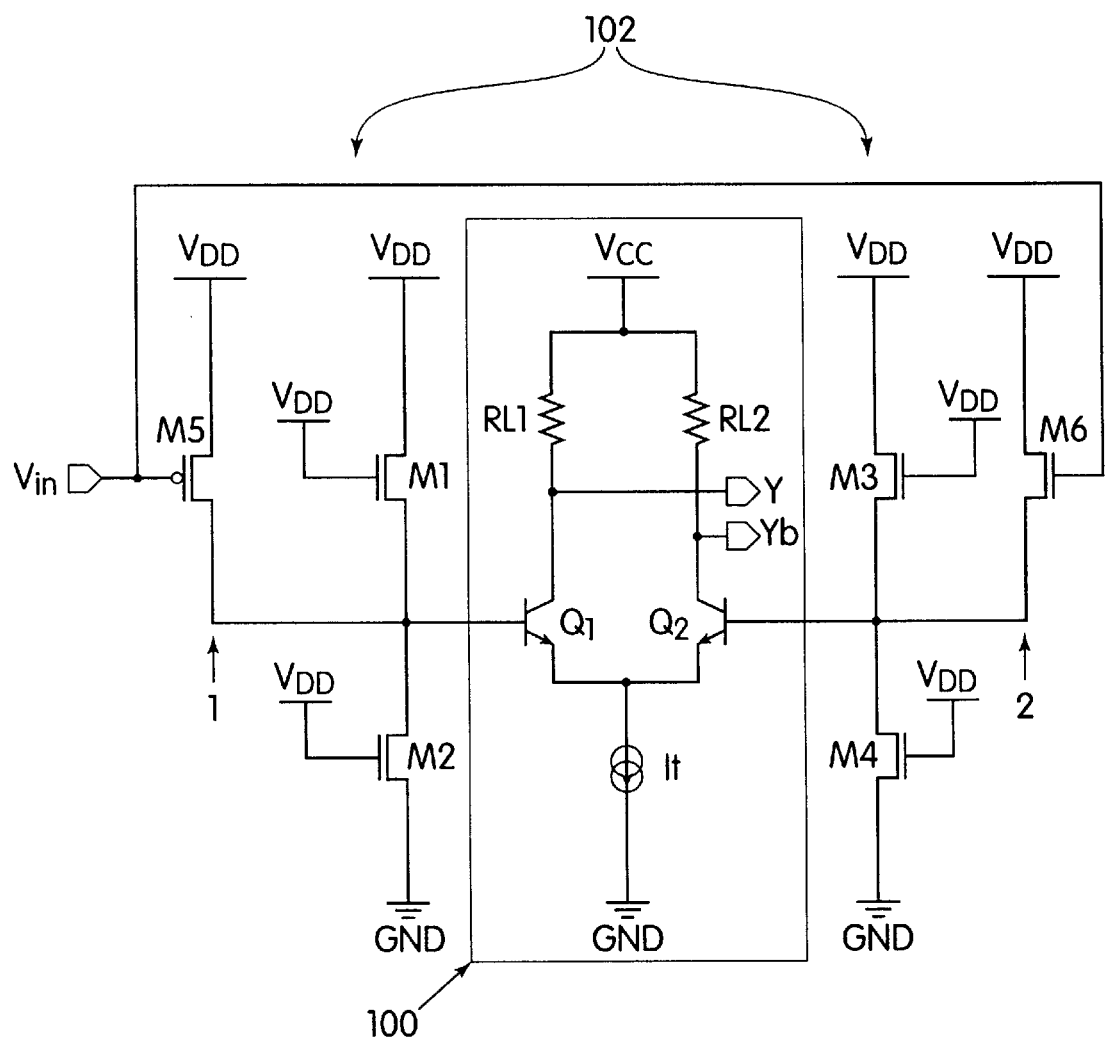
FIG. 8 is a schematic diagram of a circuit comprising n-type transistors of yet another embodiment of the circuit in FIG. 4.

FIG. 8 shows another embodiment of the present invention. The circuit of FIG. 8 is substantially the same as FIG. 4 except that the CMOS transistors M1 through M4 in interface circuit 102 are replaced with nMOS, and the gate nodes of NMOS transistor M1 and M3 are tied to VDD to turn M1 and M3 on in the operating mode.

Figure 9:
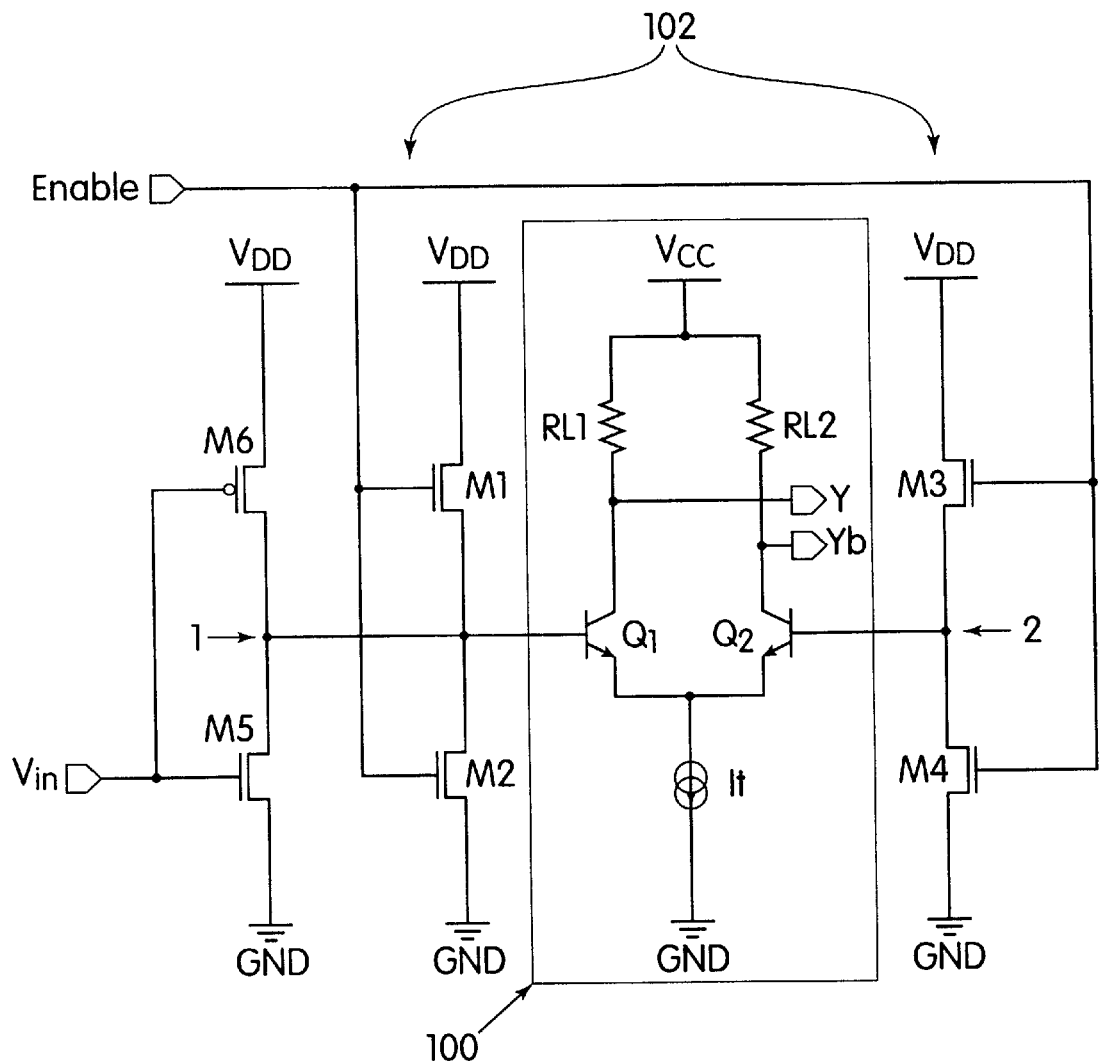
FIG. 9 is a schematic diagram of a circuit with the advantage of low power consumption of yet another embodiment of the circuit in FIG. 7.

FIG. 9 shows another embodiment of the present invention with the advantage of low power consumption. The circuit of FIG. 9 is substantially the same as FIG. 7 except that gates of transistors M1, M2, M3 and M4 in interface circuit 102 are connected to an ENABLE signal. The transistors M1, M2, M3, and M4 can be turned off by the ENABLE signal to be in a standby mode to reduce the power consumption.

Figure 10:
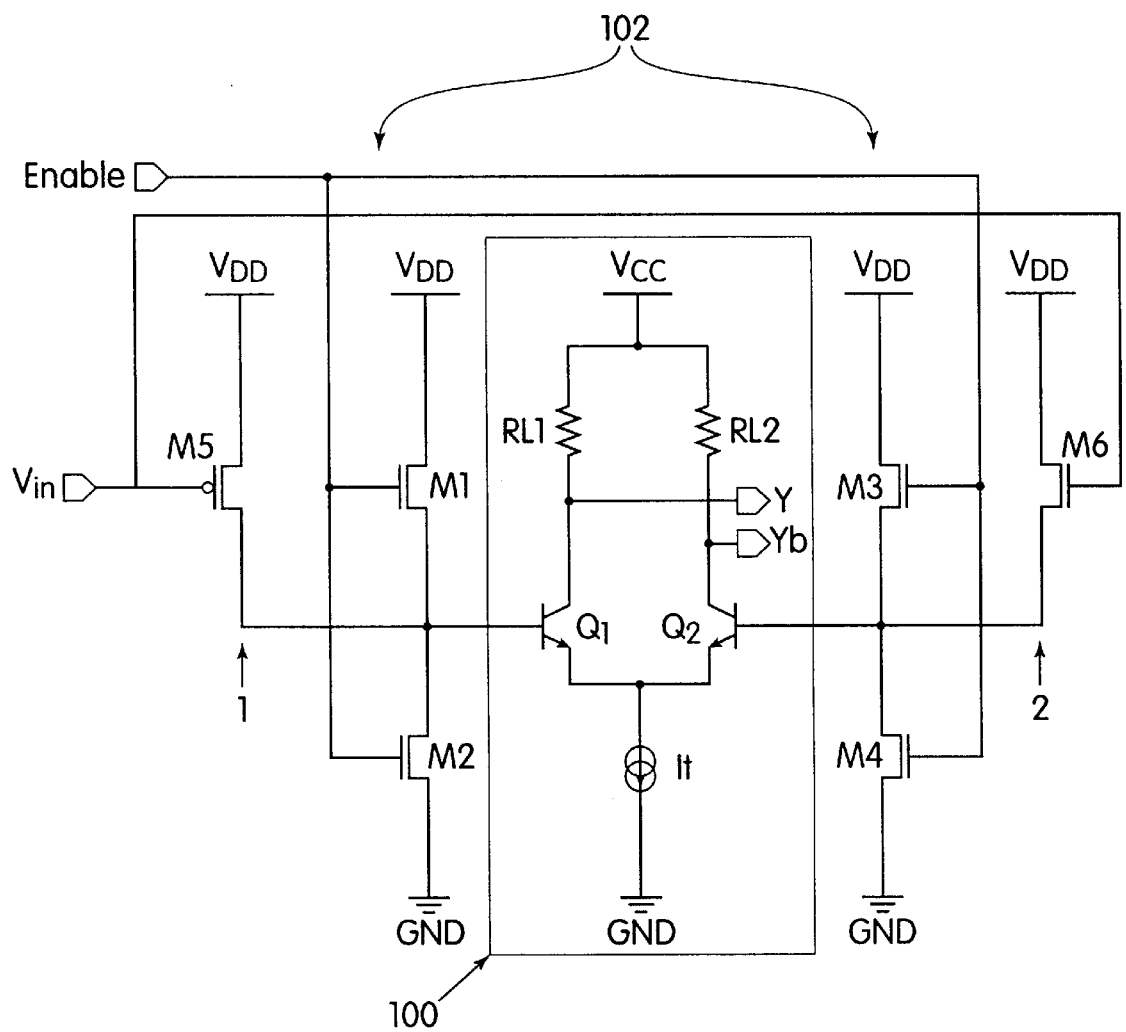
FIG. 10 is a schematic diagram of a circuit with the advantage of low power consumption of yet another embodiment of the circuit in FIG. 8.

FIG. 10 shows another embodiment of the present invention with the advantage of low power consumption. The circuit of FIG. 10 is substantially the same as FIG. 8 except that gates of transistors M1, M2, M3 and M4 in interface circuit 102 are connected to an ENABLE signal. The transistors M1, M2, M3, and M4 can be turned off by the ENABLE signal to be in a standby mode to reduce the power consumption.

Figure 11:
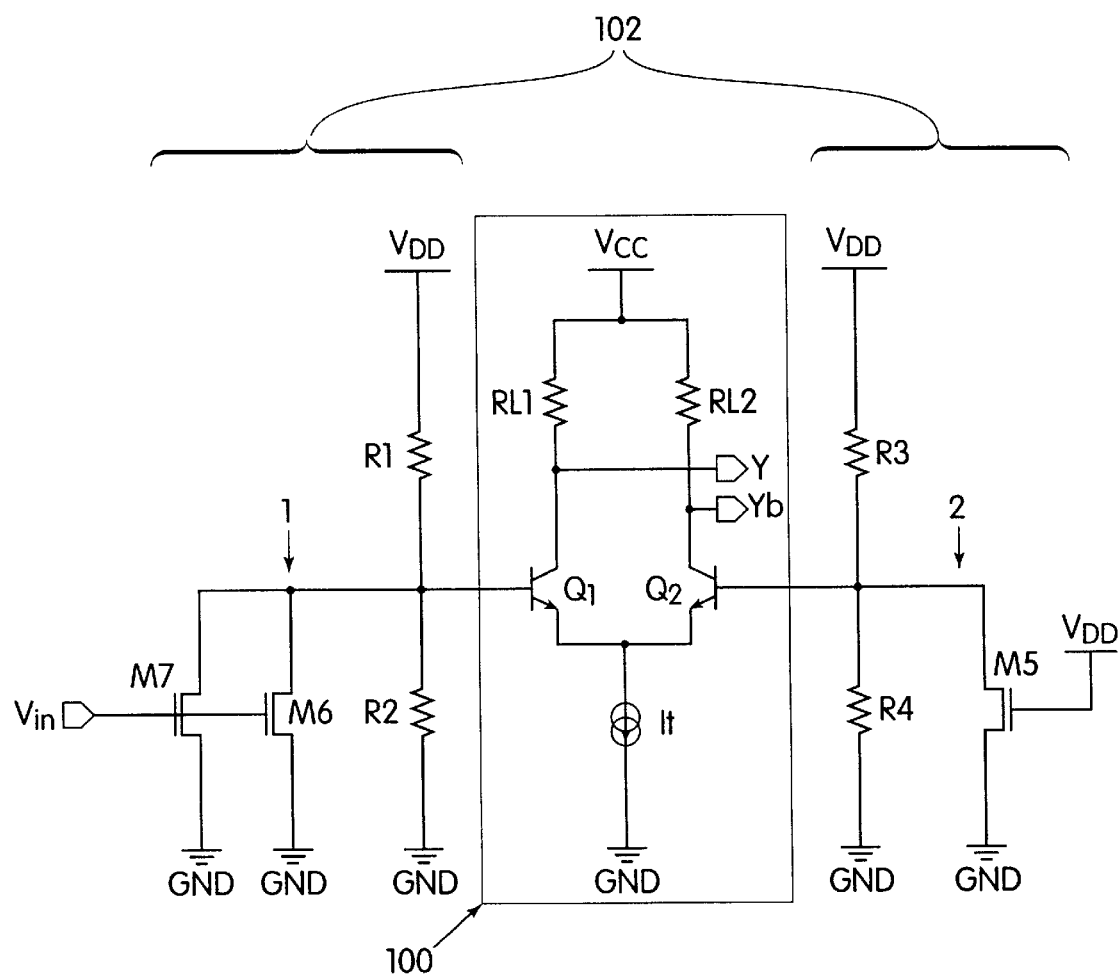
FIG. 11 is a schematic diagram of a circuit where the transistors in the interface circuit are all n-type transistors according to yet another embodiment of the present invention.

FIG. 11 shows another embodiment of the present invention. In FIG. 11, the transistors in the interface circuit 102 are all nMOS transistors. Transistors M5 and M6 have the same size. Resistors R1, R2, R3 and R4 are designed as, for example, R1/R2×R3/R4, in one embodiment, for example, R1=R3 and R2=R4. When input voltage Vin is "LOW," transistor M6 and M7 are turned off. As transistor M5 is always on, the voltage at node 2 is lower than that of node 1. Hence, the outputs in PECL 100 are Y="HIGH" and Yb="LOW."

Figure 12:
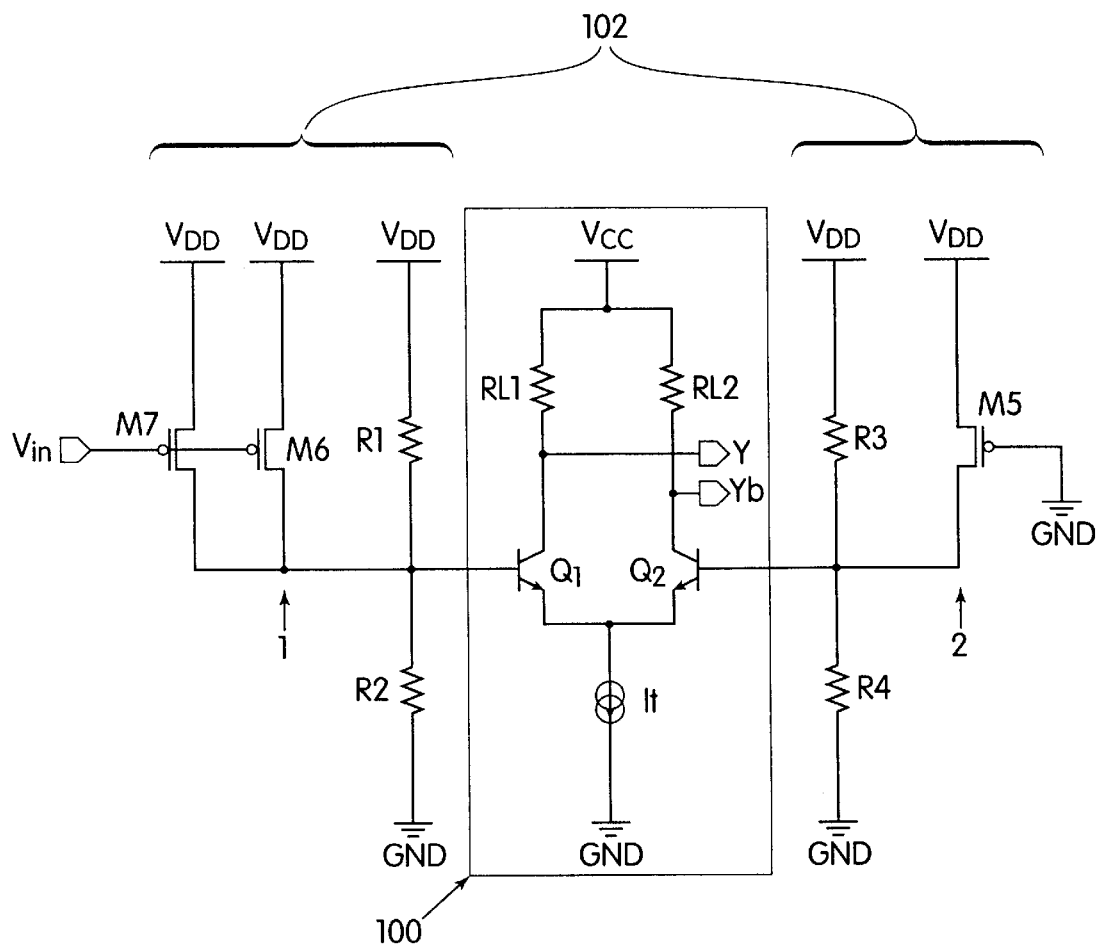
FIG. 12 is a schematic diagram of a circuit where the transistors in the interface circuit are all p-type transistors according to another embodiment of the circuit in FIG. 11.

FIG. 12 shows another embodiment of the present invention. The configuration in FIG. 12 is substantially the same as the one in FIG. 11 except that pMOS transistors are employed instead of NMOS transistors in interface circuit 102.

Figure 13:
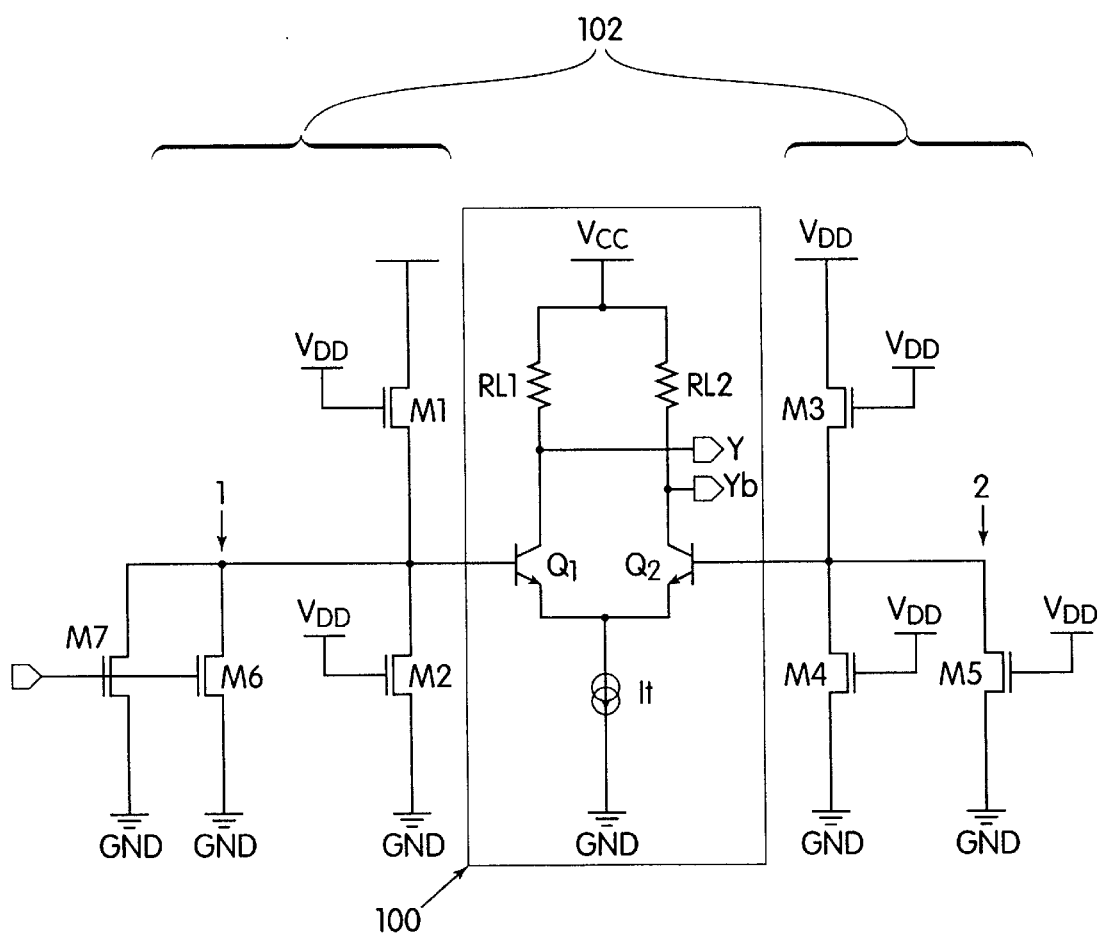
FIG. 13 is a schematic diagram of a circuit with the advantage of small area according to yet another embodiment of the circuit in FIG. 11.

FIG. 13 shows another embodiment of the present invention with the advantage of small area. The configuration of FIG. 13 is substantially the same as FIG. 11 except that the resistors R1, R2, R3, and R4 in interface circuit 102 are replaced with NMOS transistors M1, M2, M3, and M4, respectively. In some technologies, nMOS transistors need to be formed in diffusion "wells," while pMOS transistors do not need "wells." In common process technology, however, pMOS transistors need an additional layer of wells in the fabrication, while the nMOS transistors do not need wells. When the pMOS transistors need wells, if only the pMOS transistors are used in the circuit, the pMOS transistors can share the wells, and the area can be reduced. However, if nMOS and pMOS transistors are mixed, then the necessary area is larger. Since the interface circuit 102 in FIG. 13 is composed of nMOS transistors only, so the physical size of this circuit is small because it does not need n-wells for pMOS transistors.

Figure 14:
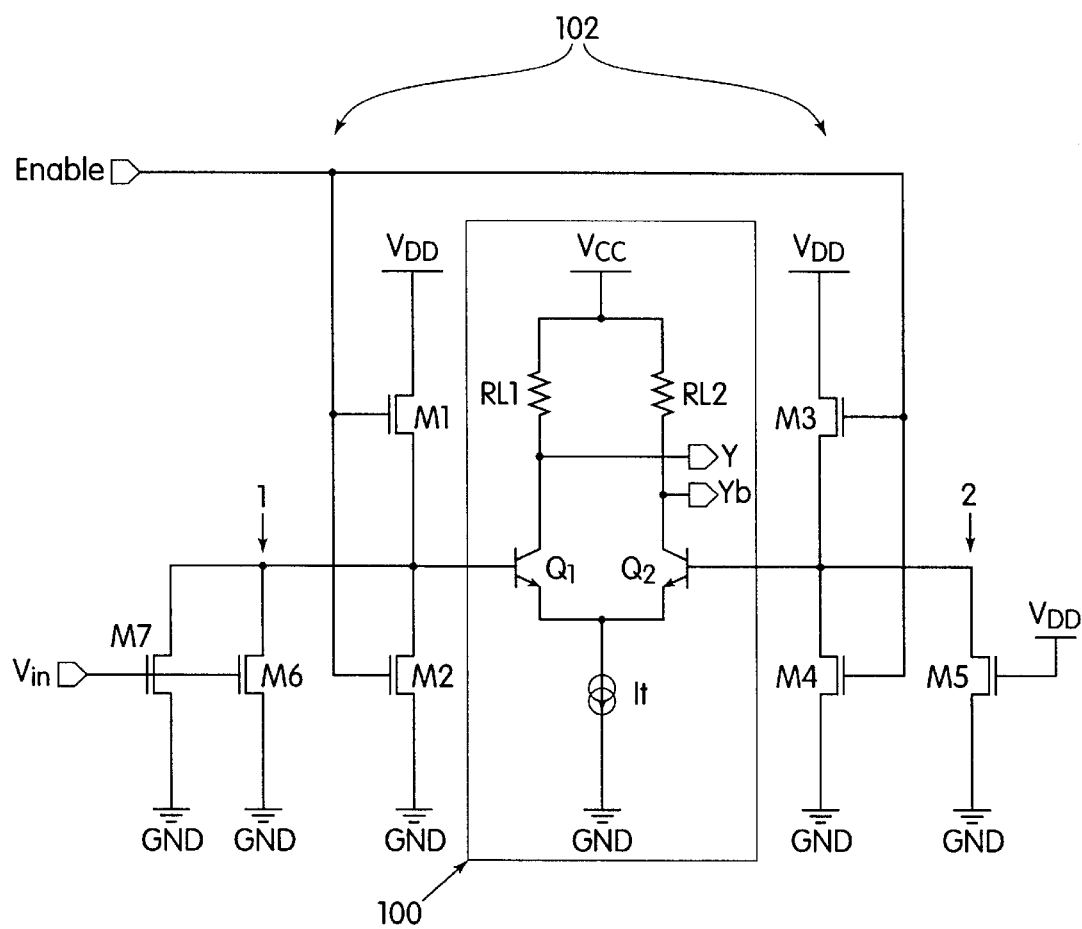
FIG. 14 is a schematic diagram of a circuit with advantages of small area and low power consumption according to another embodiment of the circuit in FIG. 13.

FIG. 14 shows another embodiment of the present invention with advantages of small area and low power consumption. The embodiment in FIG. 14 is made by adding an ENABLE signal to the circuit in FIG. 13.

Figure 15:
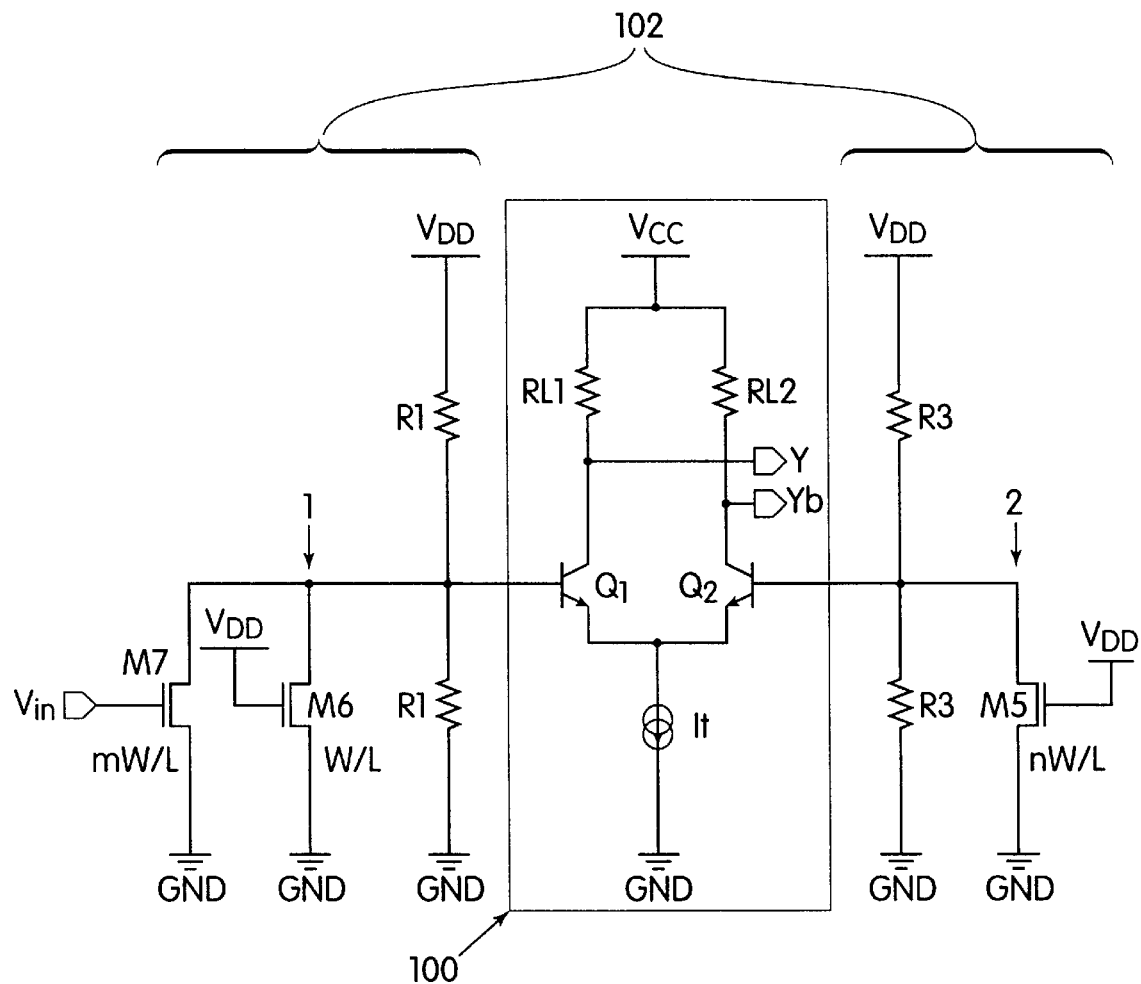
FIG. 15 is a schematic diagram of a circuit where certain transistors are independent of the input voltage, and transistor sizes are ratioed according to yet another embodiment of the present invention.

FIG. 15 shows another embodiment of the present invention. In FIG. 15, transistors M5 and M6 in interface circuit 102 are independent of the input voltage Vin, and their sizes are ratioed n:1, were n>1, preferably. When Vin="LOW," transistor M5 reduces more resistance than M6, so the voltage at node 2 is lower than that of node 1, resulting in Y="LOW," and Yb="HIGH." The size of transistor M7 is set as m(W/L) such that size of M+M6, or (m+1)W/L, is larger than size of M5, or n(W/L). For example, n is 2, and m is 3. When input voltage Vin="HIGH," transistors M7 and M6 provide more conductance than M5, so the voltage at node 1 becomes lower than the voltage at node 2, resulting in Y="HIGH," and Yb="LOW." The transistors M5, M6, and M7 can be also replaced with pMOS transistors.

Figure 16:
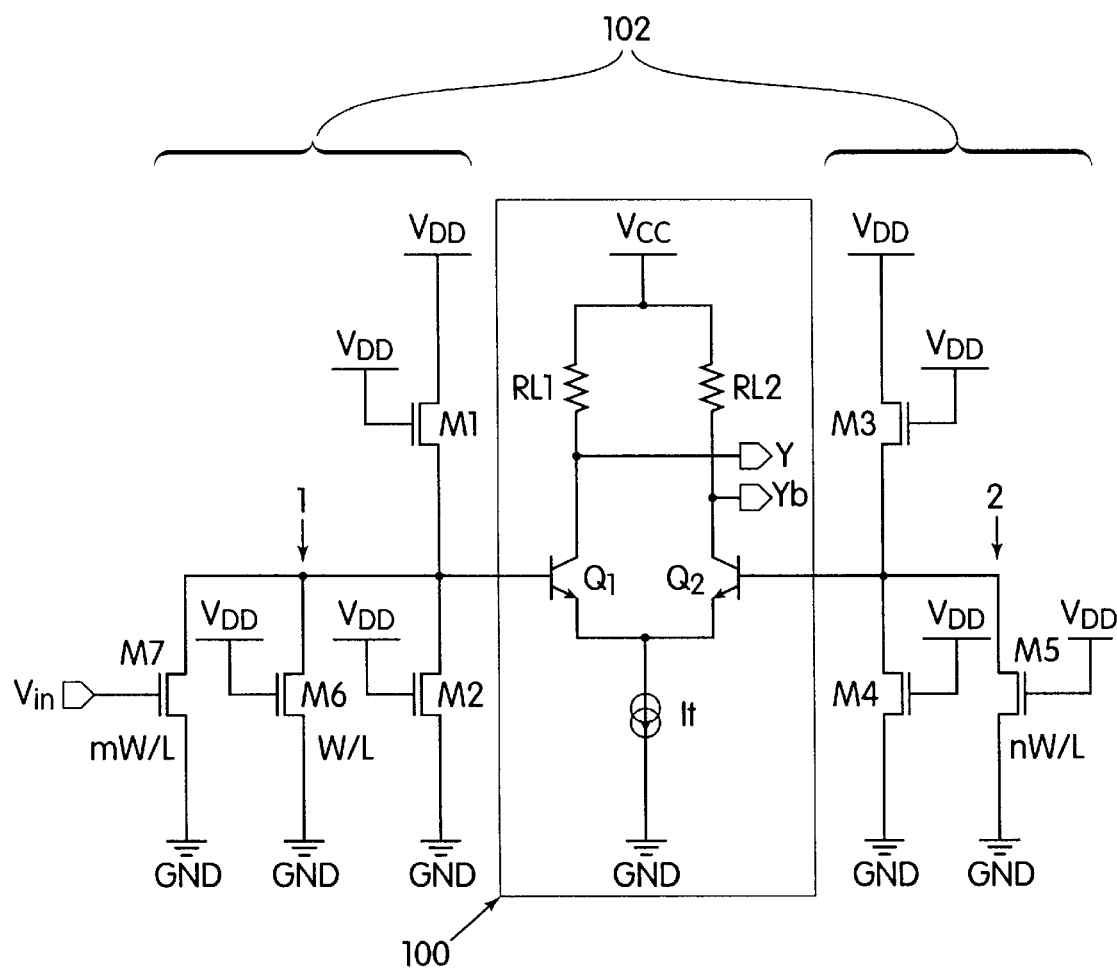
FIG. 16 is a schematic diagram of a circuit where resistors are replaced with MOS transistors according to yet another embodiment of the circuit in FIG. 15.

FIG. 16 shows another embodiment of the present invention. The circuit of FIG. 16 is substantially the same as FIG. 15 except that the resistors R1, R2, R3, and R4 in interface circuit 102 are replaced with MOS transistors M1, M2, M3, and M4, respectively. The gate nodes of transistors M1, M2, M3, and M4 are connected to VDD so that M1, M2, M3, and M4 are on all the time. As transistors M2 and M6 have the same terminal connections (drain, gate, and source connections are common), transistors M2 and M6 can be merged into a wider transistor. For the same reason, transistors M4 and M5 can be merged too.

Figure 17:
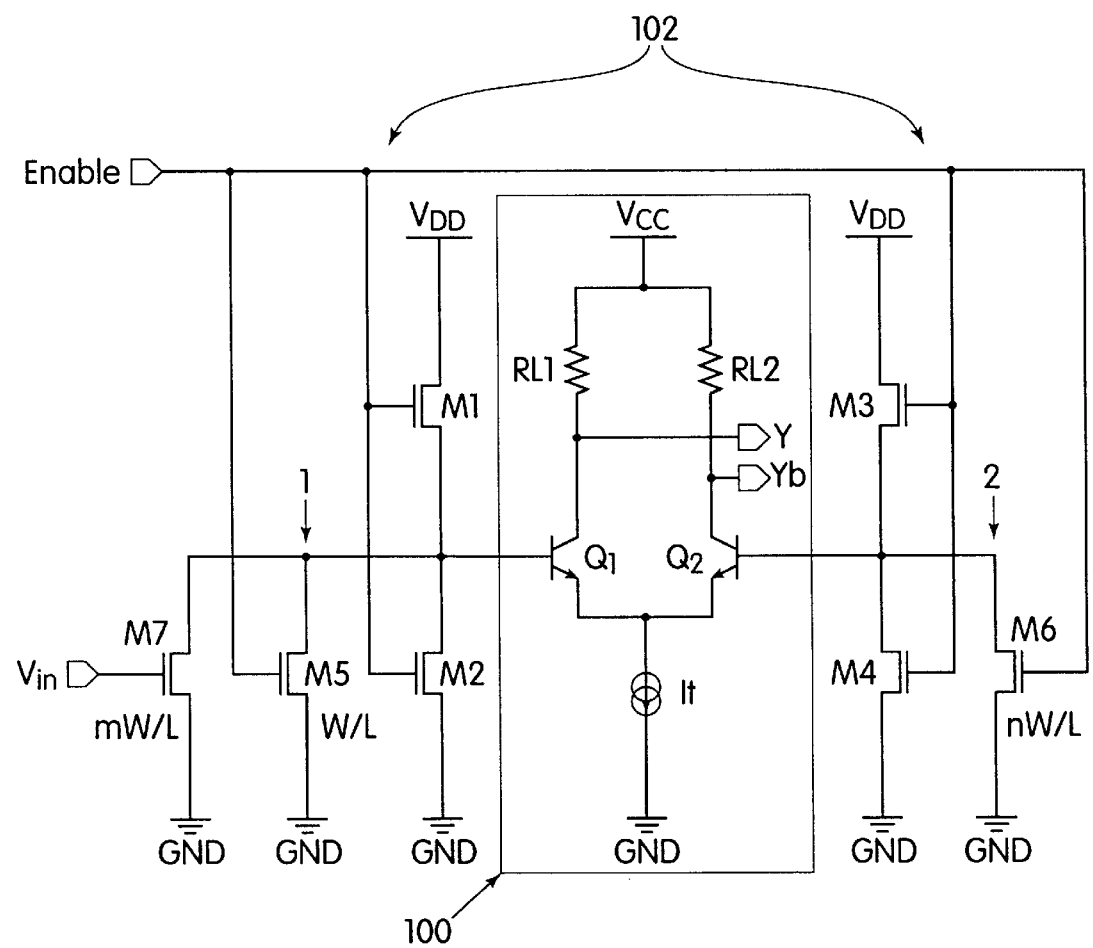
FIG. 17 is a schematic diagram of a circuit with the advantage of low power-consumption according to yet another embodiment of the circuit in FIG. 16.

FIG. 17 shows another embodiment of the present invention with the advantage of low power-consumption. The embodiment in FIG. 17 is made by connecting gates of transistors M1, M2, M3, and M4 in circuit of FIG. 16 to an ENABLE signal. The ENABLE signal is "LOW" when the circuit is not used, and the transistors M1, M2, M3, M4, M5, and M6 are turned off.

The embodiments of the present invention may include other components in addition to or instead of the components shown in the FIGS. For example, other types of transistors may be employed, or transistors with different polarity types and connections may be employed as one skilled in the art would understand.

Having described preferred embodiments of a differential-input circuit for providing differential logic signal (which are intended to be illustrative and not limiting), it is noted that modifications and variations can be made by persons skilled in the art in light of the above teachings. It is therefore to be understood that changes may be make in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A circuit for providing differential logic signals, comprising:
a differential-input circuit having a first differential input and a second differential input;
an interface circuit connected to the differential-input circuit for converting a circuit input signal to reduced swing differential logic signals and providing the reduced swing differential logic signals to the first and second differential inputs, the interface circuit comprising:
a first unit having a first resistive element connected to a supply voltage and for providing a first voltage to the first differential input via a first node, the first unit further having a second resistive element connected to the first resistive element at the first node for varying the resistance of the first and second resistive elements in response to the circuit input signal; and
a second unit which receives the supply voltage for providing a second voltage to the second differential input via a second node, wherein the differential-input circuit outputs a signal in accordance with the first and second voltages.

2. The circuit as recited in claim 1, wherein the voltage difference between the first node and the second node is smaller than the voltage difference between the circuit input voltage and ground voltage when the circuit input voltage is at a high logic level.

3. The circuit as recited in claim 1 wherein the first and second resistive elements include at least one of the transistors and resistors.

4. The circuit as recited in claim 1, wherein the first resistive element in the first unit and the second unit include complementary transistors.

5. The circuit as recited in claim 4, further comprising a logic device to provide an enable signal to the complementary transistors.

6. The circuit as recited in claim 2, wherein the first resistive element in the first unit and the third resistive element in the second unit include n-type transistors.

7. The circuit as recited in claim 6, further comprising a logic device to provide an enable signal to the n-type transistors.

8. The circuit as recited in claim 1, wherein the voltage of the first node is different from the voltage of the second node to provide an output logic state from the differential-input circuit, wherein:
the first resistive element is serially connected between the first node and ground, wherein the first resistive element connects in parallel with a second resistive element serially connected between the first node and ground, the first and second transistors being enabled by the input voltage signal, the first node further connects in parallel to a third resistive element serially connected between the supply voltage and ground; and
the second unit further comprises a fourth resistive element serially connected between the second node and ground, the second node further connects in parallel to a fifth resistive element serially connected between the supply voltage and ground.

9. The circuit as recited in claim 8, wherein the resistive elements include at least one of transistors and resistors.

10. The circuit as recited in claim 8, wherein the first and second resistive elements in the first unit and the fourth resistive element in the second unit include n-type transistors.

11. The circuit as recited in claim 8, wherein the first and the second resistive elements in the first unit and the fourth resistive element in the second unit include p-type transistors.

12. The circuit as recited in claim 8, wherein the third resistive element in the first unit and the fifth resistive element in the second unit include n-type transistors.

13. The circuit as recited in claim 12, further comprising a logic device to provide an enable signal to the n-type transistors.

14. The circuit as recited in claim 8, wherein the input voltage signal is provided only to the second resistive element in the first unit.

15. The circuit as recited in claim 14, wherein the third resistive element in the first unit and the a fifth resistive element in the second unit include complementary transistors.

16. The circuit as recited in claim 15, further comprising a logic device to provide an enable signal to the complementary transistors.

17. The circuit as recited in claim 1, wherein the differential-input circuit is a positive emitter coupled logic (PECL).

18. A circuit for providing differential logic signals, comprising:
   a differential-input circuit having a first differential input and a second differential input;
   an interface circuit connected to the differential-input circuit for converting a circuit input signal to reduced swing differential logic signals and providing the reduced swing differential logic signals to the first and second differential inputs, the interface circuit comprising:
   a first unit having a first resistive element connected to a supply voltage and for providing
   a first voltage to the first differential input via a first node, the first unit further having a second resistive element connected to the first resistive element at the first node for varying the resistance of the first and second resistive elements in response to the circuit input signal; and
   a second unit which receives the circuit input signal and the supply voltage for providing a second voltage to the second differential input via a second node, wherein the differential-input circuit outputs a signal in accordance with the first and second voltages.

19. The circuit as recited in claim 18, wherein the voltage difference between the first node and the second node is smaller than the voltage difference between the circuit input voltage and ground voltage when the circuit input voltage is at a high logic level.

20. The circuit as recited in claim 18, wherein the second resistive element includes at least one of transistors and resistors.

21. The circuit as recited in claim 19, wherein the first resistive element in the first unit and the second unit include complementary transistors.

22. The circuit as recited in claim 21, further comprising a logic device to provide an enable signal to the complementary transistors.

23. The circuit as recited in claim 19, wherein the first resistive element in the first unit and the second unit include n-type transistors.

24. The circuit as recited in claim 23, further comprises a logic device to provide an enable signal to the n-type transistors.

25. The circuit as recited in claim 18, wherein the differential-input circuit is a positive emitter coupled logic (PECL).

* * * * *